US006871336B1

(12) United States Patent
Anderson

(10) Patent No.: US 6,871,336 B1
(45) Date of Patent: Mar. 22, 2005

(54) INCREMENTAL PLACEMENT OF DESIGN OBJECTS IN INTEGRATED CIRCUIT DESIGN

(75) Inventor: Jason H. Anderson, Toronto (CA)

(73) Assignee: Xilinx, Inc., San Jose, CA (US)

( * ) Notice: Subject to any disclaimer, the term of this patent is extended or adjusted under 35 U.S.C. 154(b) by 191 days.

(21) Appl. No.: 10/273,448

(22) Filed: Oct. 17, 2002

Related U.S. Application Data
(60) Provisional application No. 60/335,850, filed on Nov. 19, 2001.

(51) Int. Cl.[7] .............................................. G06F 17/50
(52) U.S. Cl. ......................................................... 716/9
(58) Field of Search ...................................... 716/9–10

(56) References Cited

U.S. PATENT DOCUMENTS

| | | | | |
|---|---|---|---|---|
| 6,026,223 | A | * 2/2000 | Scepanovic et al. | 716/10 |
| 6,223,332 | B1 | * 4/2001 | Scepanovic et al. | 716/10 |
| 6,415,425 | B1 | * 7/2002 | Chaudhary et al. | 716/9 |
| 6,601,226 | B1 | * 7/2003 | Hill et al. | 716/10 |
| 6,701,503 | B2 | * 3/2004 | Nikitin et al. | 716/9 |

OTHER PUBLICATIONS

C. Changfan, Yu–Chin Hsu, Fur–Shing Tsai; "Timing Optimization on Routed Designs with Incremental Placement and Routing Characterization"; IEEE Transactions on computer–Aided Design of Integrated Circuits and Systems; vol. 19, No. 2; Feb. 2000; pp. 188–196.

Amir H. Ajami, Massoud Pedram; "Post–Layout Timing–Driven Cell Placement Using an Accurate Net Length Model with Movable Steiner Points"; ASIA South Pacific DAC; Copyright 2001; pp. 595–600.

Konrad Doll, Frank M. Johannes, Kurt J. Antreich; "Iterative Placement Improvement by Network Flow Methods"; IEEE Transactions on Computer–Aided Design of Integrated Circuits and Systems; vol. 13, No. 10; Oct. 1994; pp. 1189–1200.

* cited by examiner

*Primary Examiner*—Stacy A. Whitmore
(74) *Attorney, Agent, or Firm*—H. C. Chan; Kim Kanzaki

(57) ABSTRACT

An incremental placement method uses a set of connections to optimize and a set of movable design objects. The movable design objects are unplaced. A plurality of anchoring connections is associated with the movable design objects. A set of weights is associated with the set of connections to optimize and the plurality of anchoring connections. An objective function is constructed using the set of connections to optimize, the plurality of anchoring connections, and the set of weights. The objective function is minimized to obtain a placement of the movable design objects.

17 Claims, 4 Drawing Sheets

INCREMENTAL PLACEMENT OF DESIGN OBJECTS IN INTEGRATED CIRCUIT DESIGN

This application claims the benefit of U.S. Provisional Application No. 60/335,850 filed Nov. 19, 2001.

FIELD OF THE INVENTION

This invention relates to computer-aided design (CAD), and specifically, to placement of design objects in an integrated circuit.

BACKGROUND OF THE INVENTION

The design process for many integrated circuits ("chips") typically contains a number of well known sequential operations. Initially, the proposed functionality of a circuit is analyzed by one or more chip designers. These designers then use design capture tools-to enter the logical components of the circuit and their interactions. This step involves generating a description of the logic design to be implemented on the circuit chip in an appropriate machine-readable form. One of the commonly used methods for specifying a design is a hardware description language (HDL). This language contains specific functions and syntax to allow complex hardware structures to be described in a compact and efficient way. Computer-aided design tools are available to compile the HDL description specifying the design into lower forms of description. The output of the design tools is a logic design database which completely specifies the logical and functional relationships among the components of the design.

The logic design database is then passed as input to a layout tool, which typically includes a placement tool (placer) and a routing tool (router). Placement is the process whereby each component (or design object) of the design is allocated to a physical position on the chip. The aim of the placer is to place connected design objects in close physical proximity to one another. This conserves space on the chip and increases the probability that the desired interconnections will be successfully completed by the router. Additionally, the performance of the circuit may be improved because excess capacitance and resistance caused by long interconnect paths between design objects will slow down the circuit and, in certain cases, delay critical signals and possibly cause functional failures. Placement may take place either manually or automatically, or in combination. If placement is done manually, a chip designer interacts with a placement tool to define the location on the chip where each design object is to be placed. Automatic placement relies on sophisticated algorithms to place the design objects on the chip without the need for human intervention. As circuits get more complex and device geometry becomes sub-micron, it is rapidly becoming extremely difficult for a human chip designer to manage the complexity of the placement and routing operations. For example, modern designs contain tens of thousands of design objects, making the time needed for complete manual placement prohibitive.

After placement is complete, a routing step is performed. The purpose of routing is to connect the pins in each net of a logic design. A net is a collection of pins that must be connected together electrically by the router. A net may have one or more driver pins and one or more load pins. The driver pins on a net are the source of electrical signals that are fed to the load pins through an interconnection path chosen by the router. The position of the pins in any particular net are decided by the placement process. Routing determines exactly the interconnection paths between driver and load pins on a net. The routing problem can be significantly reduced in complexity if a near-optimal placement of the design objects has been achieved.

After placement and routing, it is often necessary to verify that the design functions in ways expected by the designer. This verification may be achieved by simulation. During post-layout verification, the operation of the logic design is examined. After routing, the precise resistances and capacitances of a design's interconnections are known and consequently, post-layout tools have an accurate picture of the actual circuit in the time domain. The post-layout verification, masks and test patterns are typically generated for use in manufacturing and testing the circuit.

The design tools involved in the CAD flow that are used for verification and mapping an HDL circuit into a routed circuit are commonly implemented in software executing on an engineering workstation.

It can be seen from the above that placement has an important effect on the CAD process. Thus, it is desirable to generate a placement solution that is as optimal as possible. Recently, it has been found that layout may be improved by making incremental modifications to a fully placed and/or fully routed design. Several incremental placement tools (incremental placers) have been proposed. In one approach, placement changes are made based on a characterization of a routed design. Specifically, the coupling capacitance of the routed design is measured in each placement region and these measurements are used to help estimate the effect that incremental placement changes will have on delay. Additionally, the algorithm attempts to account for the effect of placement changes on the structure of routes. The placement problem is formulated analytically as a system of equations to be solved. An example of this approach is described in C. Changfan, Y-C Hsu, and F-S Tsai, "Timing Optimization on Routed Designs with Incremental Placement and Routing Characterization," IEEE Trans. on Computer-Aided Design of Integrated Circuits and Systems, Vol. 19, No. 2, February 2000, pp. 188–196.

A second approach uses an analytical formulation with an objective function that aims to maximize the difference between required delay and actual delay on the critical paths of a routed design. One unique feature of this formulation is that it not only computes a new placement for objects on the circuit's critical path, it also determines a new placement for the Steiner points in the routing of crictical path connections. Steiner points are branch points in the routing of a net. For example, consider a net with one driver pin and two load pins, A and B. Assume we first route the connection between the driver and load A. Then, when we route to load B, we may branch off the routing path between the driver and load A. The point at which we choose to branch off is referred to as a Steiner point. Returning to the incremental placement approach, constraints are added to the formulation to avoid overly increasing the delay of near-critical paths. The incremental placement algorithm can be used within a loop which attempts to improve several critical paths in each loop iteration. An example of this approach is described in A. Ajami and M. Pedram, "Post-Layout Timing-Driven Cell Placement Using an Accurate Net Length Model with Movable Steiner Points," ASIA South Pacific DAC, 2001, pp. 595–600.

In both of the incremental placers described above, delay is computed using the "Elmore" delay model. In the Elmore model, delay between two connected objects is a continuous function of the distance between the objects. This is because wire resistance and capacitance are determined based on distance and technology-specific parameters. Therefore these placers are more suited to ASIC technology and less suitable for FPGA technology. This is because FPGAs have pre-fabricated routing resources of specific discrete lengths, which generally makes it very difficult to find a continuous function relating delay to distance.

In a third approach to incremental placement, the placement area is divided into regions and a local improvement strategy is employed in each region. The design objects placed in a region are rearranged taking delays, timing criticality and wirelength into account. The local placement task is formulated as a max-flow min-cost problem. Each region is improved sequentially and after covering the entire placement area, the regions may be redefined and the process repeated. One disadvantage of this method is that it does not consider the global placement problem—it only considers placement changes within a local placement region. An example of this approach is described in K. Doll, F. M. Johannes, and K. J. Antreich, "Iterative Placement Improvement by Network Flow Methods," IEEE Trans. on Computer-Aided Design of Integrated Circuits, Vol. CAD-13, October 1994, pp. 1190–1200.

SUMMARY OF THE INVENTION

The present invention involves a method for incremental placement of design objects in an integrated circuit. A coordinate system is set up to represent potential placement locations on the integrated circuit. A plurality of connections of a first type is received. In one embodiment, the connections of the first type are the connections to optimize. A subset of the design objects, called "movable" design objects, is associated with the plurality of connections of the first type. The movable design objects are unplaced. A plurality of anchoring connections are associated with the movable design objects. A set of weights is associated with the plurality of connections of the first type and the plurality of anchoring connections. An objective function is constructed using the plurality of connections of the first type, the plurality of anchoring connections, and the set of weights. The objective function is minimized to obtain a placement of the movable design objects. The design objects can then be fit onto the physical grid representing the integrated circuit. Finally, a routing step can be executed.

In another embodiment, a plurality of connections of a second type is also received. The connections of the second type are referred to as connections to consider. The connections to consider preferably consist of near-critical connections whose placement do not necessarily need to be improved but whose placement should not be negatively impacted. Weights are associated with the connections of the second type. The objective function also includes the connections of the second type and their associated weights.

The above summary of the present invention is not intended to describe each disclosed embodiment of the present invention. The figures and detailed description that follow provide additional example embodiments and aspects of the present invention.

DETAILED DESCRIPTION OF THE INVENTION

The present invention relates to a new method of incremental placement. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Figure 1:
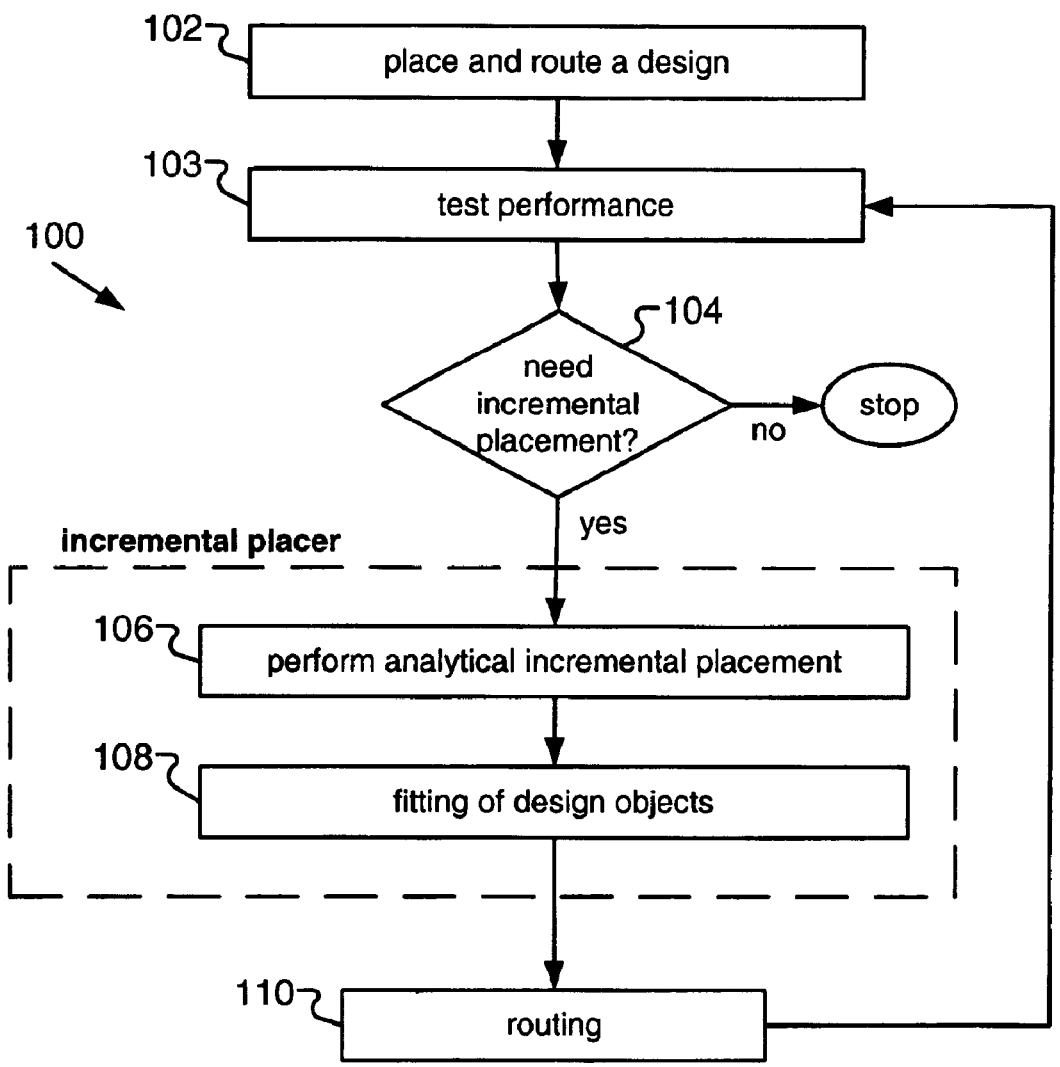
FIG. 1 is a flow chart showing a CAD process that includes incremental placement of the present invention.

FIG. 1 is a flow chart 100 showing a CAD process that includes incremental placement of the present invention. In step 102, a design is placed and routed using conventional methods. In step 103, the performance of the design is tested using conventional timing analysis tools. In step 104, the performance is evaluated to determine if incremental placement is needed. If incremental placement is not needed, flow chart 100 terminates because there is no need to modify the layout. An example where incremental placement is not needed is when the layout meets performance requirements. Another example is when the difference between actual timing performance and required timing constraint is too big to be cured by incremental placement. If performance may be improved by incremental placement, incremental placement is performed.

In the present invention, an analytic method is used for incremental placement, which involves solving several mathematical equations (step 106). After incremental placement is completed, a fitting step is performed in which the mathematical placement solution of step 106 is translated into a placement of design objects on the physical positions of a PLD (step 108) or other target IC technology. A tool that performs steps 106 and 108 is called an incremental placer. In step 110, routing is performed to complete the design. This step can be performed using any known method of routing.

After routing is completed, flow chart 100 loops back to step 103 to test the performance of the new layout. In some cases, it may be desirable to perform additional optimization using additional incremental placement steps.

In a different embodiment, an already placed design can be used as the starting point of flow chart 100. In this case, step 102 may be omitted. In yet another embodiment, incremental placement is used in a placement only system. In this embodiment, an already placed design is used as the starting point and the routing step (step 110) is omitted from flow chart 100. In this case, a loop back to step 103 takes place after step 108 (instead of step 110).

Figure 2A:
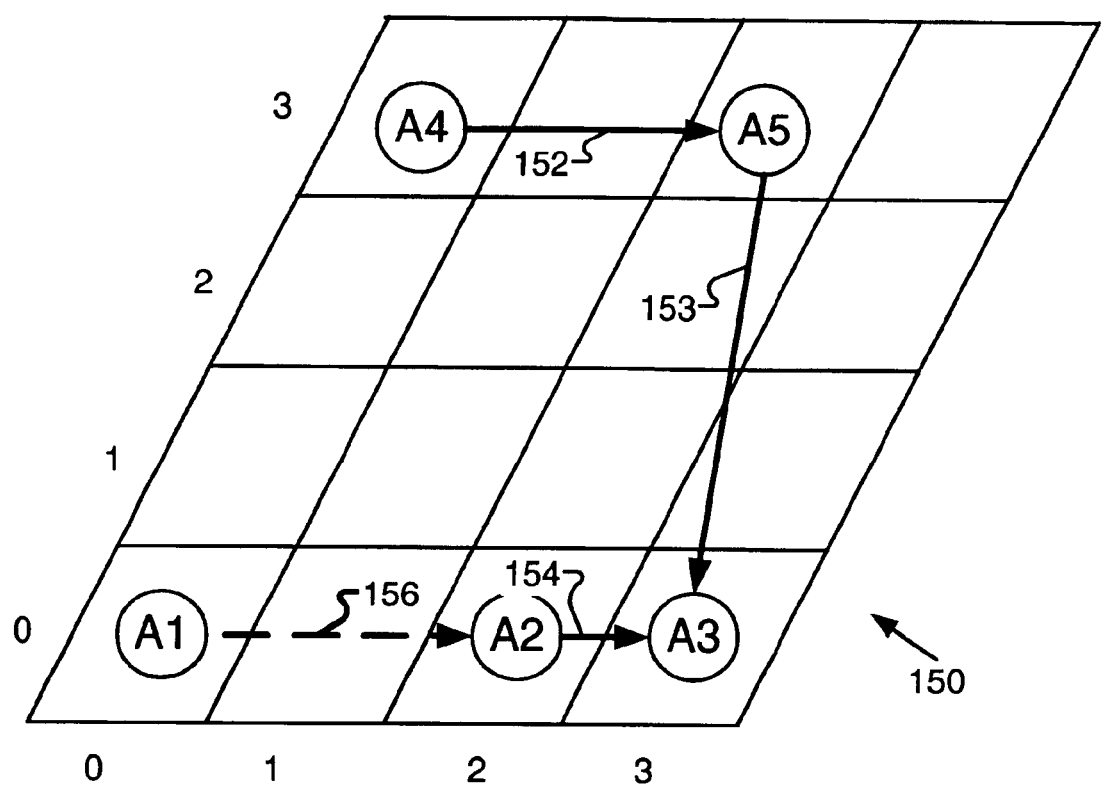
FIG. 2A shows an exemplary grid that can be used in the present invention.

Details of step 106 of the present invention are described below. A coordinate system is set up to identify the location of design objects. In one embodiment, the space in a PLD used for placing design objects is conceptually divided into rectangular or square grids using horizontal and vertical lines. An exemplary grid 150 is shown in FIG. 2A. The vertical lines are shown slanted to facilitate three dimensional viewing, which will become clear in connection with FIG. 2B. A coordinate system is used to mark positions of grid 150. In FIG. 2A, each square is uniquely identified by a horizontal and a vertical value, starting from 0. A plurality of design objects used in incremental placement, shown as labeled circles in FIG. 2A, are positioned in some of the squares. In FIG. 2A, sixteen squares and five design objects (labeled A1 to A5) are shown. It should be noted that the present invention is applicable to any number of squares and design objects.

The design objects are connected by connections. FIG. 2A shows the two types of connections that are relevant to our incremental placer (other connections between the design objects are not shown): (a) connections to optimize, shown as solid lines 152–154, and (b) connections to consider, shown as dashed line 156. In the present invention, the "connections to optimize" are the connections in the design that do not meet the user's timing constraints. The incremental placer of the present invention attempts to improve the delay of these connections which generally involves bringing the driver and load of each connection closer together. The "connections to consider" are the connections that are marginally meeting timing constraints, i.e., if the delays of these connections are increased too much, they will no longer meet timing constraints. An actual design may have many connections of each type, and the number of connections shown in FIG. 2A is illustrative only. The connections to optimize are preferably a subset of the timing critical connections in a design. The goal is to improve the placement of these connections, allowing the design to meet requirements (e.g. timing constraints). The set of connections to consider preferably consists of near-critical connections whose placements do not necessarily need to be improved, but whose placements should not be greatly disrupted or made worse.

One aspect of the present invention is that design objects that are attached to the connections to optimize are movable. In the present invention, a third type of connection, called an anchoring connection, is introduced. The purpose of an anchoring connection is to "anchor" movable design objects to their old placement positions, thus encouraging objects to not stray far from their old locations. The anchoring connections are applied to design objects that need to be incrementally placed. By changing the weights of the anchoring connections, it is possible to have direct control over how far objects are allowed to be moved by the incremental placer.

Figure 2B:
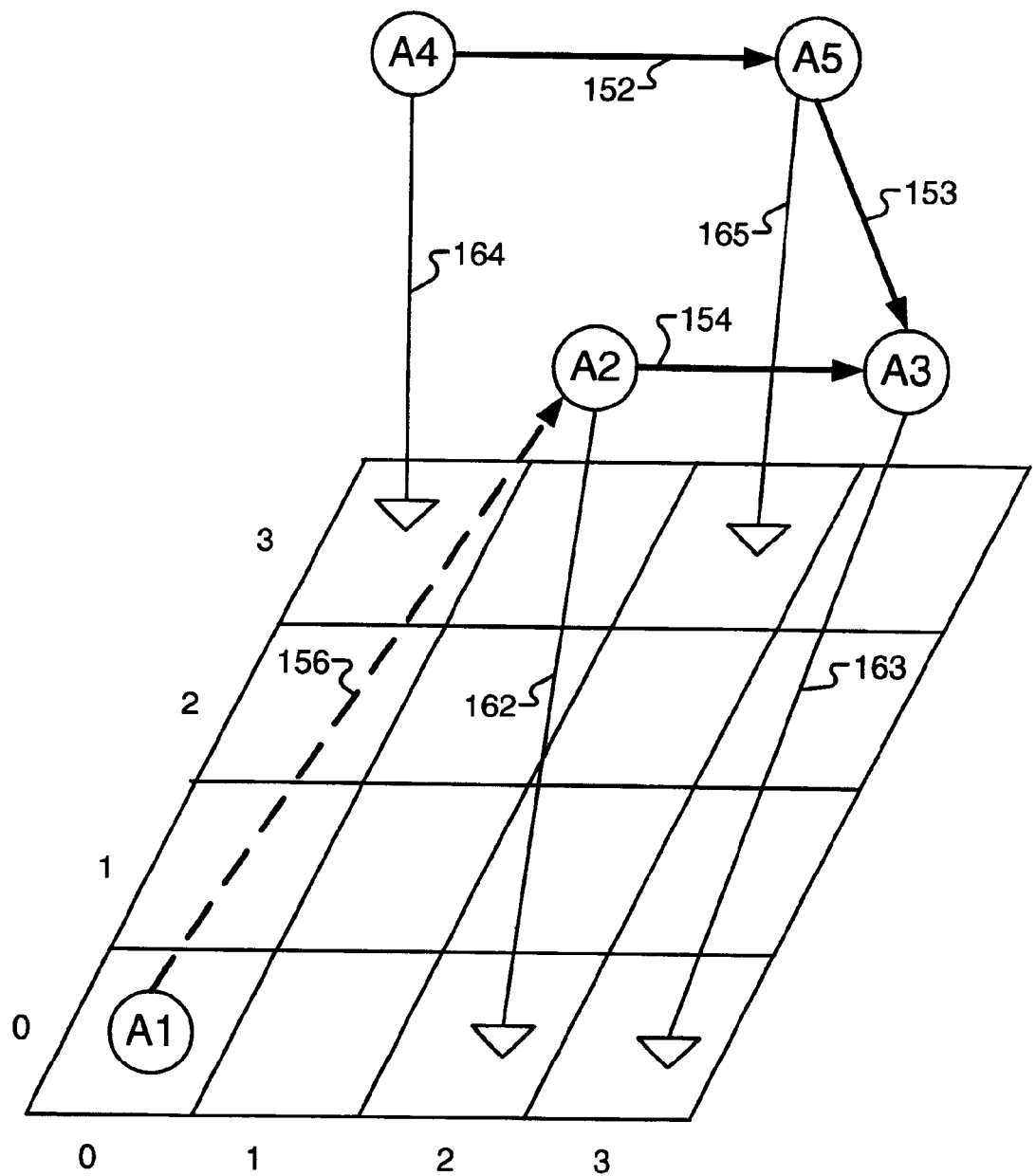
FIG. 2B shows anchoring connections that can be used in the present invention.

FIG. 2B shows the three kinds of connections. The grids, design objects, connections to optimize, and connections to consider are the same as that in FIG. 2A. Elements that are common in FIGS. 2A and 2B have the same reference numerals. In FIG. 2B, the "moveable" design objects have been unplaced from their old placement locations. The unplaced objects are shown raised above the placement grid. Anchoring connections 162–165 connect unplaced design objects A2–A5 to their old placement locations. In FIG. 2B, design object A1 does not attach to a connection to optimize and therefore, object A1 is not moveable and does not undergo incremental placement. Consequently, there is no need to introduce an associated anchoring connection for object A1.

Figure 3:
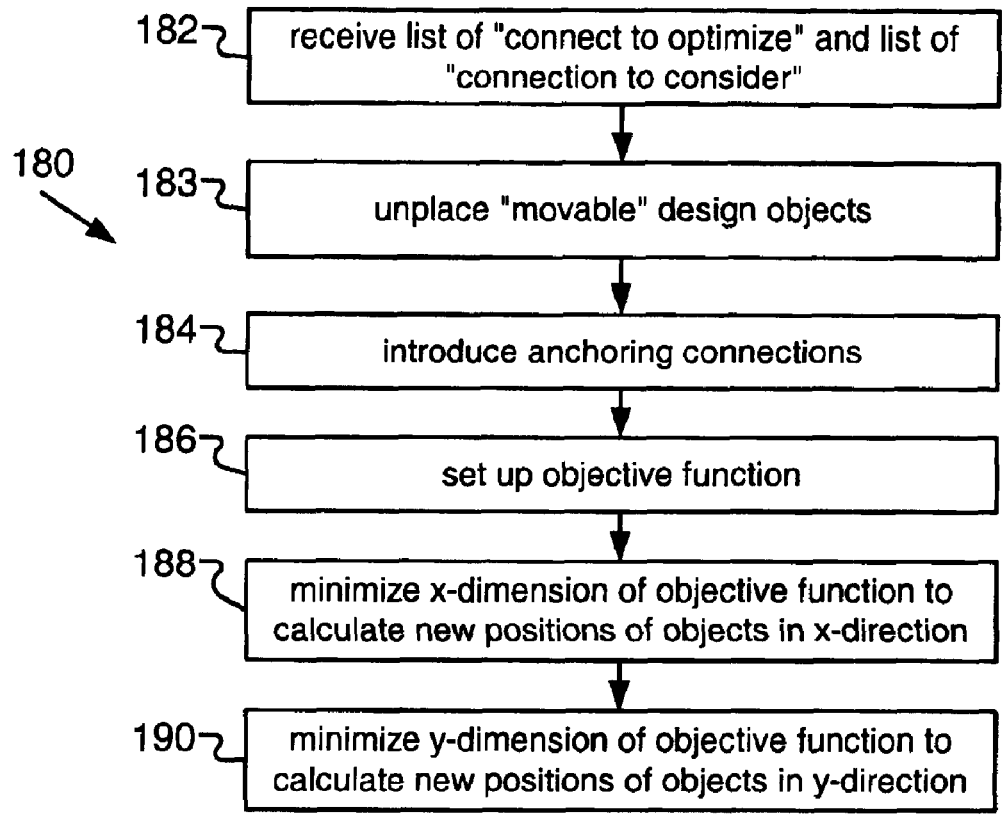
FIG. 3 is a flow chart of an incremental placer of the present invention.

FIG. 3 is a flow chart 180 showing the steps used in an incremental placer to calculate new positions of the design objects that undergo incremental placement. In step 182, the list of "connections to optimize" and list of "connections to consider" are obtained from the result of a conventional placer and router. In step 183, design objects that attach to a connection to optimize are unplaced. These unplaced design objects are referred to as the moveable objects. In step 184, anchoring connections are introduced into the design to connect the unplaced design objects with their old placement locations. The weights associated with each of the anchoring connections can be entered by a design engineer or generated automatically by software tools.

Once the list of connections to optimize and consider are processed and the anchoring connections have been introduced, an objective function $\Phi$ can be written as follows:

$$\Phi = \sum_{conn_i \in S_{opt}} w_{conn_i} \cdot L(conn_i) + \sum_{conn_i \in S_{consid}} w_{conn_i} \cdot L(conn_i) + \sum_{conn_i \in S_{anchor}} w_{conn_i} \cdot L(conn_i)$$

where
$S_{opy}$ represents the set of connections to optimize,
$S_{consid}$ represents the set of connections to consider,
$S_{anchor}$ represents the set of anchoring connections,
$conn_i$ represents a connection in one of the sets,
$w_{conn_i}$ represents a scalar weight, and
$L(conn_i)$ represents the length of the connection $conn_i$.
The goal is to find a placement solution that minimizes the objective function.

In the above equation, $w_{conn_i}$ is a scalar weight that represents the importance of $conn_i$ and $L(conn_i)$ represents the length of the connection $conn_i$. For the case of connection s belonging to $S_{opt}$ and $S_{consid}$, the value for $w_{conn_i}$ is preferably chosen based on criticality, with highly critial connections receiving higher weights than less critical connections. Connection weights may also be chosen using criteria other than timing criticality, for example, net characteristics such as net fanout or connection length. In the case of connections belonging to $S_{anchor}$, the values for $w_{conn_i}$ are chosen based the desired distance that design objects are allowed to move from the locations they occupied prior to being unplaced. Larger values of $w_{conn_i}$ for this set of connections imply smaller placement changes. In one embodiment, the length of a connection is measured by its squared Euclidean distance. For example, for a given $conn_i$ representing a connection between two design objects, k and j, its length is:

$$L(conn_i) = (x_j - x_k)^2 + (y_j - y_k)^2$$

where $x_j$, $y_j$, $x_k$ and $y_k$ represent the placements of objects j and k in the x and y dimensions. Note that when $conn_i$ corresponds to an anchoring connection or a connection to consider, one of the two points (either $x_j$, $y_j$ or $x_k$, $y_k$) may be fixed.

In the present invention, the placement of objects is determined by mimizing the objective function $\Phi$. This will give rise to a set of equations, the solution of which is the placement of the objects. The solution can be found by minimizing the objective function separately in the x and y dimensions. Specifically, the objective function can be written in the following form:

$$\Phi = \Phi_x + \Phi_y$$

where $\Phi_x$ represents the parts of the objective function relating to the x-dimension and $\Phi_y$ is the part relating to the y-dimension. Function $\Phi_x$ can be mimimized separately from $\Phi_y$. This is the basis for steps 188 and 190 in FIG. 3.

$\Phi_x$ can be expressed in matrix form as:

$$\Phi_x = \tfrac{1}{2}\vec{x}^T A \vec{x} - \vec{b}^T \vec{x} + \text{const}$$

where const is a constant value and $\vec{x}$ is an n-dimensional vector representing the placements of the moveable design objects in the x-dimension. A is an n-by-n matrix and $\vec{b}$ is an n-dimensional vector. The second term, $\vec{b}^T\vec{x}$, exists as a result of connections to fixed objects or fixed locations (which reflect the connections to consider and the anchoring connections).

To minimize function $\Phi_x$ the partial derivative is taken with respect to each of the n different x variables, producing a system of n linear equations. Setting these linear equations to zero and solving the system will yield a set of values for $\vec{x}$ corresponding to the minimum of function $\Phi_x$. The system of linear equations has the following form:

$$A\vec{x} - \vec{b} = 0$$

Note that an equivalent system of equations must be solved to yield the vector of placements, $\vec{y}$, in the y-dimension. The system of linear equations can be solved using standard techniques, such as the conjugate gradient method, yielding a placement for each design object in a real-valued coordinate system.

Notice that in this formulation, there are no constraints that prohibit objects from overlapping one another. Consequently, in the resulting placement, objects may be placed overlapping with other design objects. In conventional placers, complex overlap removal techniques are used to remove the overlaps. One aspect of the incremental placer of the present invention is that overlap removal tools are not needed. As can be seen from the above, the present incremental placer often deals with only a small number of moveable design objects (relative to the total number of design objects). Thus, the number of overlaps that is created is relatively small. As a result, the present invention does not need to perform overlap removal (although it may be performed if desired), and the placer proceeds directly to a fitting step in which the real-valued placement locations, that result from solving the system of equations, are used to determine a placement for the design objects on the physical grid.

Figure 4:
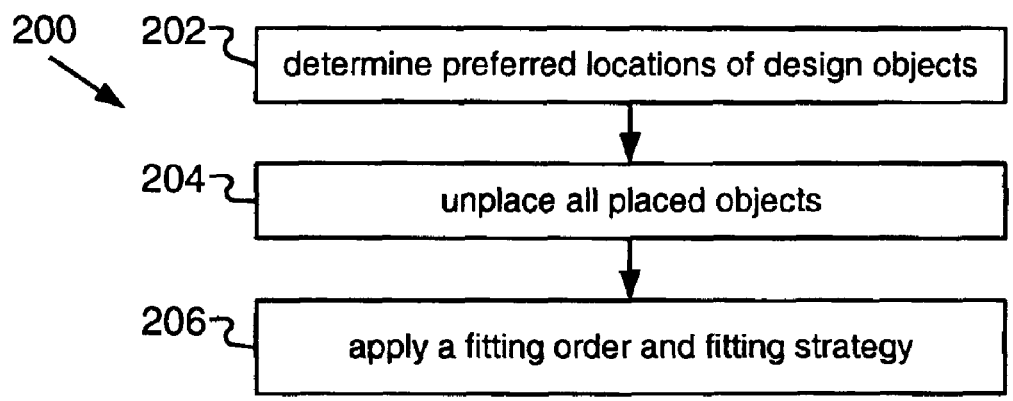
FIG. 4 is a flow chart showing a fitting procedure of the present invention.

FIG. 4 is a flow chart showing a fitting procedure 200 of the present invention. In step 202, the preferred locations of the design objects are determined. This is performed in one of two ways:

For the objects that were designated as movable in connection with the incremental placer shown in flow chart 180, the preferred placement locations are taken from the placement values in the $\vec{x}$ (and $\vec{y}$) vector that results from solving the system of equations described therein, or for objects that remain unmoved after the steps of flow chart 180 are performed, their preferred location are set to be equal to their current placement.

After the preferred locations are determined, all the placed objects are unplaced (step 204). The preferred placement values are used as a guide for fitting. The design objects are then sorted into a specific "fitting order" that determines the order in which objects will be fit (or placed) onto the physical grid. Objects that are fit first are most likely to be placed at or close to their preferred location. For example, a fitting order may favor design objects that are attached to a connection to optimize. After ordering the objects, each object is considered in turn and a fitting strategy is applied. One strategy is to employ a simple breadth-first fitting algorithm. For each object to fit, its preferred location is tried first. If that location is already occupied, the object is fit to one of the locations that neighbor the preferred location. If these locations are also occupied, the search continues outward, until a vacant location is found.

It should be noted that if a PLD contains specific hardware features, they should also be taken into account in fitting. These are device specific issues that are best handled on a case-by-case basis.

One advantage of the present invention is its simplicity: its formulation is a system of linear equations. This is a convex optimization problem with a single solution that can be solved using well-known mathematical techniques. On the other hand, many prior art incremental placement methods are non-convex and therefore cannot be solved using standard quadratic programming techniques.

Another advantage of the present invention is the size of its problem formulation, which is proportional to the number of connections to optimize and consider, and is not proportional to the size of the entire design. In particular, if there are c connections in the list of connections to optimize, the number of variables is less than or equal to $4c$ ($2c$ variables for the x-dimension and $2c$ variables for the y-dimension). The run-time needed to formulate and solve the system of linear equations of the present invention is proportional to the number of variables in the system. Since the number of connections to optimize and consider is generally much smaller than the total number of connections in the design, the run-time by incurred using the incremental placer of the present invention is substantially less than that needed to compute a new placement for all design objects.

One more advantage is the ease with which the allowable amount of change to an existing placement can be controlled. As described above, an anchoring connection is used to control the extent of movement of a movable object. For example, the weight assigned to an anchoring connection can be set to a very low value, thereby allowing the object to move freely towards the objects it connects to. Alternately, a very high weight could be assigned, thereby forcing the object to remain close to its old placement position.

It can be seen from the above description that a novel incremental placement method has been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

I claim:

1. A method for placing design objects of an integrated circuit, comprising:

setting up a coordinate system to represent potential placement locations on the integrated circuit;

receiving a plurality of connections of a first type;

receiving a plurality of connections of a second type;

identifying a set of movable design objects, the set of movable design objects being a subset of the design objects and associated with the plurality of connections of the first type;

unplacing the movable design objects;

introducing a plurality of anchoring connections associated with the movable design objects;

receiving a set of weights, each member of the set of weights associated with one of the plurality of connections of the first type or one of the plurality of anchoring connections or one of the plurality of connections of the second type;

constructing an objective function using the plurality of connections of the first type, the plurality of connections of the second type, the plurality of anchoring connections, and the set of weights; and minimizing the objective function to obtain a placement of the movable design objects.

2. The method of claim 1 wherein the objective function comprises a sum of a plurality of terms, each of the terms comprising a product of one of the weights and a length of one of the plurality of connections of the first type or one of the plurality of anchoring connections.

3. The method of claim 2 wherein the length is a squared Euclidean distance.

4. The method of claim 1 wherein the minimizing step comprises separately minimizing x and y directions of the objective function.

5. The method of claim 1 further comprising a step of fitting the movable design objects.

6. The method of claim 5 wherein the fitting step further comprises:

determining preferred locations on the integrated circuit;

unplacing the design objects; and applying a fitting strategy using the preferred locations.

7. The method of claim 1 wherein the connections of the first type are selected based on timing constraint consideration.

8. The method of claim 1 wherein the objective function comprises a sum of a plurality of terms, each of the terms comprising a product of one of the weights and a length of one of the plurality of connections of the first type, one of the plurality of connections of the second type, or one of the plurality of anchoring connections.

9. The method of claim 8 wherein the length is a squared Euclidean distance.

10. The method of claim 1 wherein the minimizing step comprises separately minimizing x and y directions of the objective function.

11. The method of claim 1 further comprising a step of fitting the movable design objects.

12. The method of claim 11 wherein the fitting step further comprises:

determining preferred locations on the integrated circuit;

unplacing the design objects; and applying a fitting strategy using the preferred locations.

13. The method of claim 1 wherein the connections of the first type are selected based on a first timing constraint requirement and the connections of the second type are selected based on a second timing constraint requirement.

14. The method of claim 1 wherein the set of weights is selected based on timing constraints.

15. The method of claim 1 wherein the set of weights is selected based on net characteristics.

16. The method of claim 15 wherein the net characteristics is associated with fanout.

17. The method of claim 1 wherein the set of weights is selected based on desired amount of placement change.

* * * * *